(12) United States Patent
Wu et al.

(10) Patent No.: US 11,749,965 B2
(45) Date of Patent: Sep. 5, 2023

(54) TRANSISTOR FOR EMITTING LASER WITH A FIXED FREQUENCY

(71) Applicant: National Taiwan University, Taipei (TW)

(72) Inventors: Chao-Hsin Wu, Taipei (TW); Chien-Ting Tung, New Taipei (TW); Shu-Wei Chang, Taichung (TW)

(73) Assignee: National Taiwan University, Taipei (TW)

( * ) Notice: Subject to any disclaimer, the term of this patent is extended or adjusted under 35 U.S.C. 154(b) by 256 days.

(21) Appl. No.: 16/928,000

(22) Filed: Jul. 14, 2020

(65) Prior Publication Data

US 2022/0021182 A1 Jan. 20, 2022

(51) Int. Cl.
*H01S 5/00* (2006.01)
*H01S 5/062* (2006.01)
*H01S 5/34* (2006.01)
*B82Y 20/00* (2011.01)
*B82Y 10/00* (2011.01)

(52) U.S. Cl.
CPC ...... *H01S 5/06203* (2013.01); *H01S 5/06206* (2013.01); *H01S 5/34* (2013.01); *B82Y 10/00* (2013.01); *B82Y 20/00* (2013.01)

(58) Field of Classification Search
CPC .... H01S 5/06203; H01S 5/34; H01S 5/06206; H01S 5/0614
See application file for complete search history.

(56) References Cited

U.S. PATENT DOCUMENTS

| | | | | |
|---|---|---|---|---|
| 4,801,993 A * | 1/1989 | Ankri | ...................... | H01S 5/026 372/50.1 |
| 5,111,255 A * | 5/1992 | Kiely | ................... | H01L 29/7783 257/E29.05 |
| 5,239,550 A * | 8/1993 | Jain | ..................... | H01S 5/06203 372/45.01 |
| 2007/0201523 A1* | 8/2007 | Walter | ................ | H01S 5/06203 257/E33.044 |
| 2010/0073086 A1* | 3/2010 | Holonyak, Jr. | ........... | H03F 3/08 330/149 |
| 2010/0078623 A1* | 4/2010 | Feng | .................... | H01L 33/0016 257/14 |
| 2010/0085995 A1* | 4/2010 | Feng | ................... | H01S 5/06203 257/14 |
| 2010/0289427 A1* | 11/2010 | Walter | .................... | H01L 33/06 257/14 |
| 2013/0093352 A1* | 4/2013 | Feng | ................... | H01L 33/0041 438/31 |
| 2013/0094532 A1* | 4/2013 | Feng | ....................... | H03D 9/00 372/96 |
| 2014/0050241 A1* | 2/2014 | Dallesasse | .......... | H01S 5/06203 372/45.01 |

(Continued)

*Primary Examiner* — Kinam Park
(74) *Attorney, Agent, or Firm* — Winston Hsu

(57) ABSTRACT

A transistor for emitting laser with a fixed frequency includes a first region, a second region, at least one quantum well, and a third region. The at least one quantum well is installed in the second region, and the second region is coupled between the first region and the third region. When one of the first region, the second region, and the third region receives two signals, or two of the first region, the second region, and the third region receive the two signals respectively, the at least one quantum well emits the laser with the fixed frequency.

7 Claims, 3 Drawing Sheets

(56) References Cited

U.S. PATENT DOCUMENTS

| | | | |
|---|---|---|---|
| 2015/0014632 A1* | 1/2015 | Kim | H01L 29/66318 438/312 |
| 2015/0255954 A1* | 9/2015 | Feng | H01S 5/18369 438/29 |
| 2015/0318666 A1* | 11/2015 | Hammar | H01S 5/187 372/45.01 |
| 2019/0123513 A1* | 4/2019 | Feng | H01S 5/3054 |

* cited by examiner

100

TRANSISTOR FOR EMITTING LASER WITH A FIXED FREQUENCY

BACKGROUND OF THE INVENTION

1. Field of the Invention

The present invention relates to a transistor, and particularly to a transistor for emitting laser with a fixed frequency.

2. Description of the Prior Art

In the prior art, a system for emitting laser with a fixed frequency usually is composed of an device and a frequency modulator coupled to the device, wherein the device is used for generating laser, and the frequency modulator is used for modulating a frequency of the laser to emit the laser with the fixed frequency. The device is usually a laser diode, and a difference between the laser diode and a light-emitting diode is that there are two parallel optical mirrors in the laser diode, wherein the two parallel optical mirrors form an optical resonator. The optical resonator is used for making light generated in the laser diode oscillate repeatedly in the optical resonator and then emits stable laser. The frequency modulator is usually an electro-absorption modulator, wherein the electro-absorption modulator is a semiconductor, and the electro-absorption modulator is used for modulating the frequency of the laser by voltage. Operational principle of the electro-absorption modulator is based on Franz-Keldysh effect, wherein Franz-Keldysh effect means that absorption spectrum of the electro-absorption modulator can be changed by electric field applied to the electro-absorption modulator. Because the system is composed of the device and the frequency modulator, volume of the system is larger, and loss of the laser generated by the laser diode occurs during the transmission between the device and the frequency modulator. Therefore, how to integrate the system into a single device to overcome the above-mentioned shortcomings of the system becomes an important issue of a designer of the system.

SUMMARY OF THE INVENTION

An embodiment of the present invention provides a transistor for emitting laser with a fixed frequency. The transistor includes a first region, a second region, at least one quantum well, and a third region. The at least one quantum well is installed in the second region, and the second region is coupled between the first region and the third region. When one of the first region, the second region, and the third region receives two signals, or two of the first region, the second region, and the third region receive the two signals respectively, the at least one quantum well emits the laser with the fixed frequency.

In another embodiment of the present invention, the first region, the second region, and the third region include a first semiconductor material, the at least one quantum well includes a second semiconductor material, polarity of the first region is identical to polarity of the third region, the polarity of the first region is different from polarity of the second region, and the first semiconductor material is different from the second semiconductor material.

In another embodiment of the present invention, the second semiconductor material is used for emitting the laser with the fixed frequency, and the second semiconductor material is Aluminum gallium arsenide, or Aluminum gallium indium phosphide, or Indium gallium phosphide or Indium gallium nitride, or Zinc oxide.

In another embodiment of the present invention, the first semiconductor material is Gallium arsenide, or Indium gallium phosphide, or Aluminum gallium arsenide, and material of the first region, the second region, and the third region may not be the same at the same time.

In another embodiment of the present invention, when the one of the first region, the second region and the third region receives the two signals, or when the two of the first region, the second region, and the third region receive the two signals respectively, the two signals are used to generate an intrinsic current flowing into the at least one quantum well and generate an intrinsic reverse bias between the second region and the third region, and the intrinsic current and the intrinsic reverse bias correspond to the laser with the fixed frequency.

In another embodiment of the present invention, the at least one quantum well emits the laser with the fixed frequency by utilizing current modulation mechanism corresponding to the intrinsic current and voltage modulation mechanism corresponding to the intrinsic reverse bias.

In another embodiment of the present invention, the current modulation mechanism changes carrier concentration of the at least one quantum well through the intrinsic current to make the at least one quantum well generate a first laser, and the voltage modulation mechanism utilizes Franz-Keldysh effect to modulate the first laser to emit the laser with the fixed frequency.

In another embodiment of the present invention, the two signals are two voltage signals, or two current signals, or one voltage signal and one current signal.

The present invention provides the transistor for emitting the laser with the fixed frequency. The transistor makes the at least one quantum well in the transistor emit laser with a fixed frequency by utilizing current modulation mechanism corresponding to an intrinsic current induced by two signals inputted to the transistor and voltage modulation mechanism corresponding to an intrinsic reverse bias induced by the two signals inputted to the transistor. Therefore, compared to the prior art, because the transistor is a single integrated device and capable of emitting the laser with the fixed frequency, the present invention can effectively solve the shortcomings of larger volume and much loss of the prior art.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
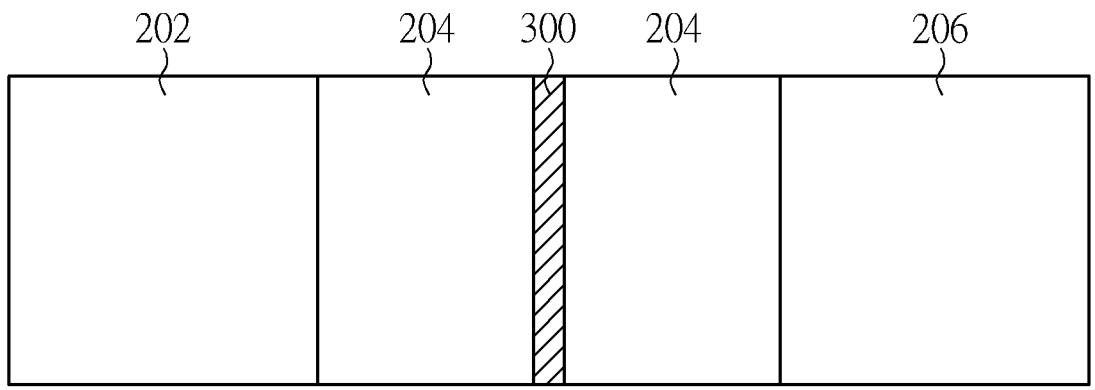
FIG. 1A is a diagram illustrating a transistor for emitting laser with a fixed frequency according to a first embodiment of the present invention.
Figure 1B:
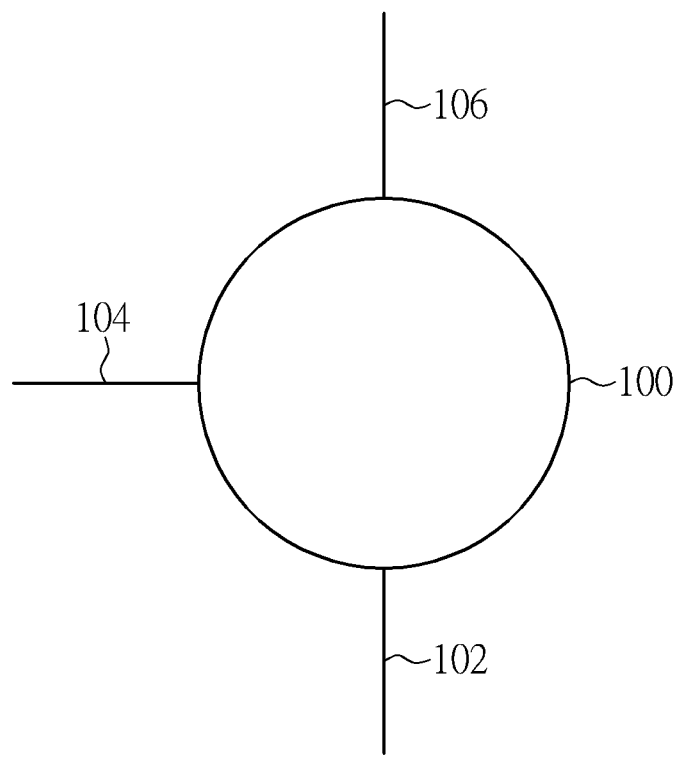
FIG. 1B is a diagram illustrating the first region being coupled to first input/output pin, the second region being coupled to second input/output pin, and the third region being coupled to third input/output pin.

Please refer to FIG. 1A. FIG. 1A is a diagram illustrating a transistor 100 for emitting laser with a fixed frequency according to a first embodiment of the present invention, wherein the transistor 100 includes a first region 202, a second region 204, a quantum well 300, and a third region 206, wherein the quantum well 300 is installed in the second region 204, and the second region 204 is coupled between the first region 202 and the third region 206. But, the present invention is not limited to the transistor 100 including the quantum well 300, that is, the transistor 100 can include multiple quantum wells. In addition, in one embodiment of the present invention, the first region 202 is emitter, the second region 204 is base, and the third region 206 is collector. The first region 202, the second region 204, and the third region 206 include a first semiconductor material, and the quantum well 300 include a second semiconductor material, wherein polarity of the first region 202 is identical to polarity of the third region 206, and the polarity of the first region 202 is different from polarity of the second region 204, wherein the first semiconductor material is Gallium arsenide, or Indium gallium phosphide, or Aluminum gallium arsenide, and material of the first region 202, the second region 204, and the third region 206 may not be the same at the same time, and the second semiconductor material is Aluminum gallium arsenide, or Aluminum gallium indium phosphide, or Indium gallium phosphide, or Indium gallium nitride, or Zinc oxide. However, the present invention is not limited to the first semiconductor material being Gallium arsenide, or Indium gallium phosphide, or Aluminum gallium arsenide, and the second semiconductor material being Aluminum gallium arsenide, or Aluminum gallium indium phosphide, or Indium gallium phosphide, or Indium gallium nitride, or Zinc oxide. In one embodiment of the present invention, the first region 202 and the third region 206 include N-type semiconductor material, and the second region 204 includes P-type semiconductor material. But, in another embodiment of the present invention, the first region 202 and the third region 206 include the P-type semiconductor material, and the second region 204 includes the N-type semiconductor material. In addition, as shown in FIG. 1B, the first region 202 is coupled to a first input/output pin 102, the second region 204 is coupled to a second input/output pin 104, and the third region 206 is coupled to a third input/output pin 106.

In one embodiment of the present invention, when the transistor 100 operates, the second input/output pin 104 can receive a first signal S1 and the third input/output pin 106 can receive a second signal S2, wherein the first signal S1 is a current signal and the second signal S2 is a voltage signal. In addition, when the transistor 100 operates, a first DC (direct current) bias V1 is coupled between the first input/output pin 102 and the second input/output pin 104, and a second DC bias V2 is coupled between the second input/output pin 104 and the third input/output pin 106. In addition, an equivalent circuit can be referred to FIG. 2 when the transistor 100 operates according to the first signal S1 and the second signal S2.

Figure 2:
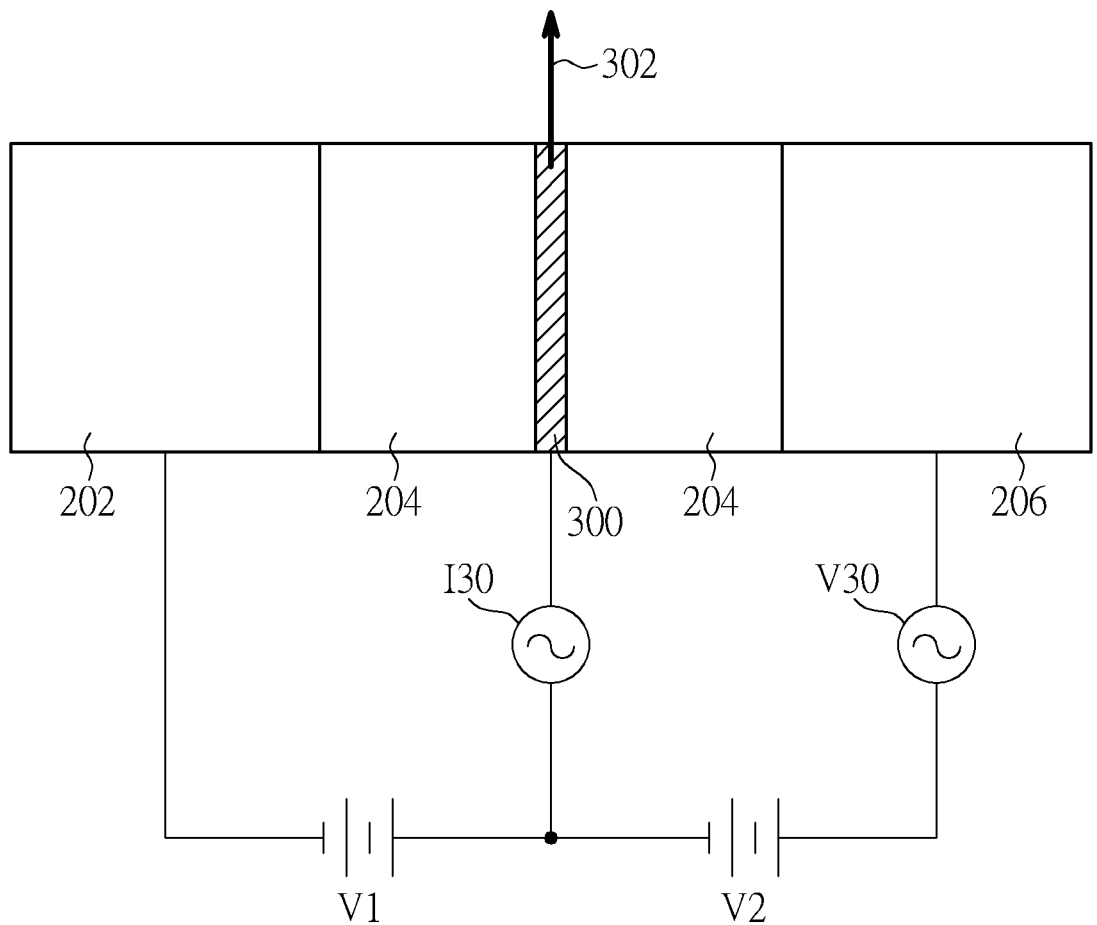
FIG. 2 is a diagram illustrating an equivalent circuit when the transistor operates according to the first signal and the second signal.
Figure 3:
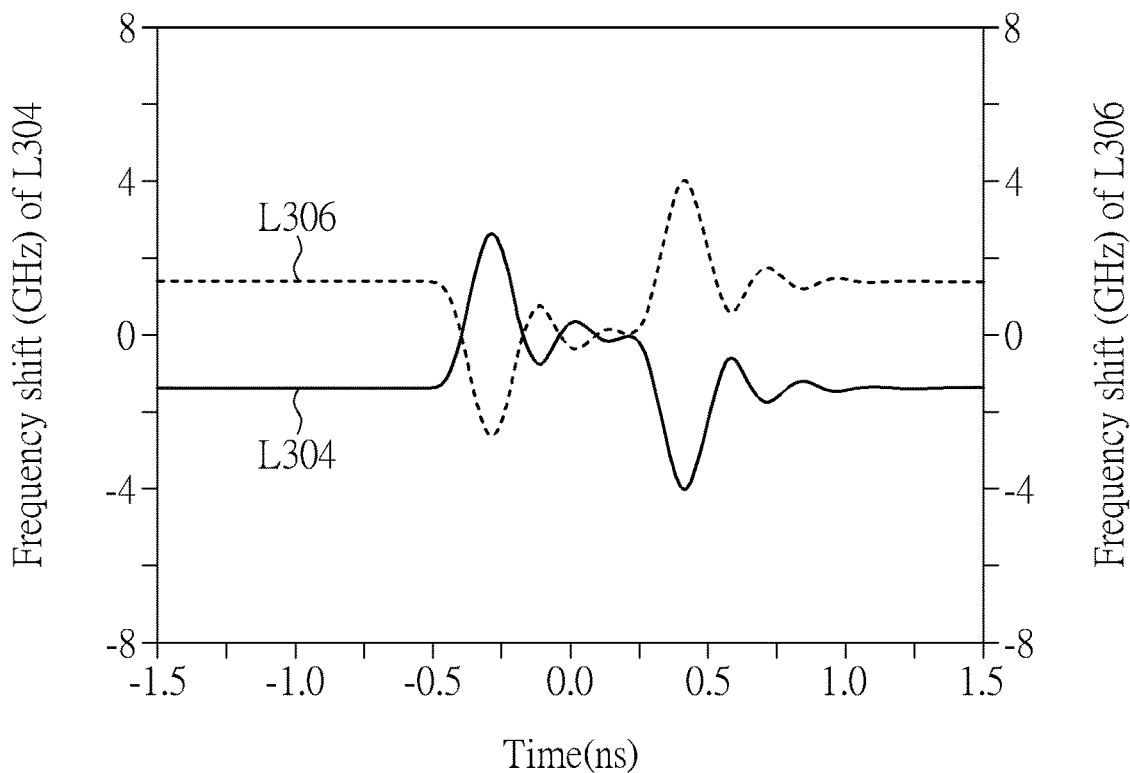
FIG. 3 is a diagram illustrating frequency shift of first laser and frequency shift of second laser being opposite.
Figure 4:
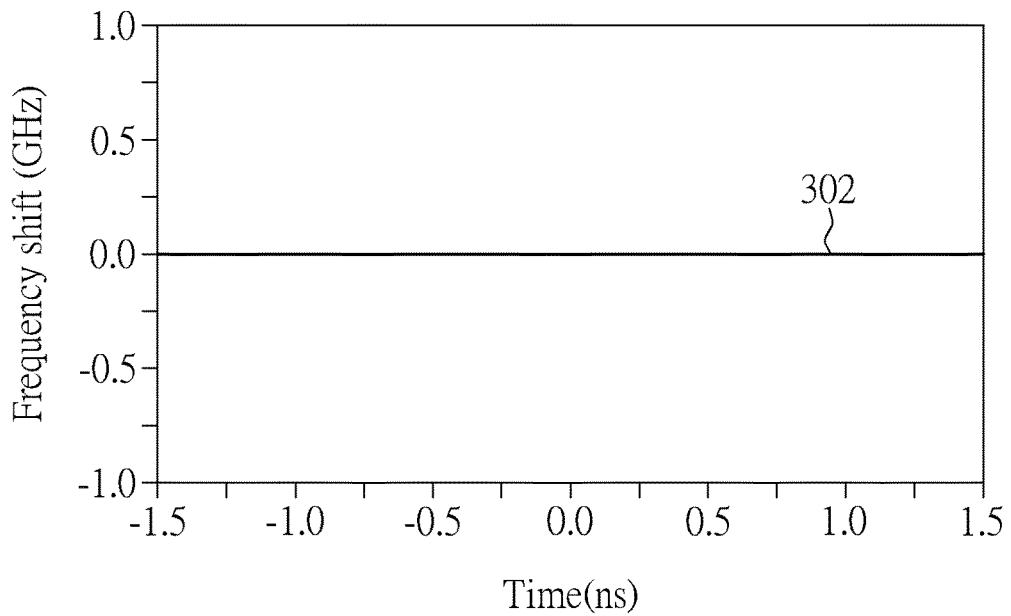
FIG. 4 is a diagram illustrating frequency shift of the laser with the fixed frequency being zero.

As shown in FIG. 2, the first DC bias V1 and the second DC bias V2 can make the transistor 100 operate normally, and the first signal S1 and the second signal S2 can make an intrinsic current 130 flow into the quantum well 300 and generate an intrinsic reverse bias V30 between the second region 204 and the third region 206 (because the transistor 100 has characteristics of an ordinary transistor, the transistor 100 can use internal parasitic circuits to convert the first signal S1 and the second signal S2 into the intrinsic current 130 and the intrinsic reverse bias V30, wherein the above-mentioned conversion process is called an electrical transfer function). The transistor 100 can make the quantum well 300 emit a fixed frequency laser 302 by current modulation mechanism corresponding to the intrinsic current 130 and voltage modulation mechanism corresponding to the intrinsic reverse bias V30. That is to say, the current modulation mechanism changes carrier concentration of the quantum well 300 through the intrinsic current 130 so that the quantum well 300 generates first laser L304 (as shown in FIG. 3), and the voltage modulation mechanism modulates the first laser L304 by Franz-Keldysh effect generated by the intrinsic reverse bias V30 to make the quantum well 300 generate second laser L306 (as shown in FIG. 3), wherein as shown in FIG. 3, frequency shift of the first laser L304 and frequency shift of the second laser L306 are opposite, and the first laser L304 and the second laser L306 can be regard as the laser of the same source, but they are discussed respectively for convenience of explanation, so the quantum well 300 can finally emit the fixed frequency laser 302 according to the first laser L304 and the second laser L306. Therefore, as shown in FIG. 4, a frequency of the fixed frequency laser 302 is independent of time, that is, frequency shift of the fixed frequency laser 302 is zero.

In addition, in another embodiment of the present invention, the first signal S1 and the second signal S2 can be two current signals, or two voltage signals, or the first signal S1 is a voltage signal and the second signal S2 is a current signal. In addition, in another embodiment of the present invention, the first signal S1 and the second signal S2 can be received by the first input/output pin 102, or by the second input/output pin 104, or by the third input/output pin 106, or by two of the first input/output pin 102, second input/output pin 104, and the third input/output pin 106, or it can be received by the first input/output pin 102, the second input/output pin 104, and the third input/output pin 106 at the same time, and the present invention is not limited to only including the first input/output pin 102, the second input/output pin 104, and the third input/output pin 106.

To sum up, the transistor of the present invention makes the quantum well in the transistor emit the laser with the fixed frequency by utilizing the current modulation mechanism corresponding to the intrinsic current induced by the two signals inputted to the transistor and the voltage modulation mechanism corresponding to the intrinsic reverse bias induced by the two signals inputted to the transistor. Therefore, compared to the prior art, because the transistor is a single integrated device and capable of emitting the laser with the fixed frequency, the present invention can effectively solve the shortcomings of larger volume and much loss of the prior art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A transistor for emitting laser with a fixed frequency, comprising:
a first region;
a second region;

at least one quantum well installed in the second region; and a third region, wherein the second region is coupled between the first region and the third region;

wherein when a first DC (direct current) bias is coupled between the first region and the second region and a second DC bias is coupled between the second region and the third region to make the transistor operate normally, one of the first region, the second region, and the third region receives two signals from outside of the transistor, or two of the first region, the second region, and the third region receive the two signals respectively from the outside of the transistor to make the at least one quantum well emit the laser with the fixed frequency, wherein the first DC bias and the second DC bias are different from the two signals, and the two signals are two voltage signals, or two current signals, or one voltage signal and one current signal.

2. The transistor of claim 1, wherein the first region, the second region, and the third region comprise a first semiconductor material, the at least one quantum well comprises a second semiconductor material, polarity of the first region is identical to polarity of the third region, the polarity of the first region is different from polarity of the second region, and the first semiconductor material is different from the second semiconductor material.

3. The transistor of claim 2, wherein the second semiconductor material is used for emitting the laser with the fixed frequency, and the second semiconductor material is Aluminum gallium arsenide, or Aluminum gallium indium phosphide, or Indium gallium phosphide, or Indium gallium nitride, or Zinc oxide.

4. The transistor of claim 2, wherein the first semiconductor material is Gallium arsenide, or Indium gallium phosphide, or Aluminum gallium arsenide, and material of the first region, the second region, and the third region may not be the same at the same time.

5. The transistor of claim 1, wherein when the one of the first region, the second region and the third region receives the two signals, or when the two of the first region, the second region, and the third region receive the two signals respectively, the two signals are used for generating an intrinsic current flowing into the at least one quantum well and generating an intrinsic reverse bias between the second region and the third region, and the intrinsic current and the intrinsic reverse bias correspond to the laser with the fixed frequency.

6. The transistor of claim 5, wherein the at least one quantum well emits the laser with the fixed frequency by utilizing current modulation mechanism corresponding to the intrinsic current and voltage modulation mechanism corresponding to the intrinsic reverse bias.

7. The transistor of claim 6, wherein the current modulation mechanism changes carrier concentration of the at least one quantum well through the intrinsic current to make the at least one quantum well generate a first laser, and the voltage modulation mechanism utilizes Franz-Keldysh effect to modulate the first laser to emit the laser with the fixed frequency.

* * * * *